(12) United States Patent
Aoki

(10) Patent No.: US 6,759,725 B2
(45) Date of Patent: Jul. 6, 2004

(54) LIGHT RECEIVING ARRAY, METHOD OF MANUFACTURING THE ARRAY, AND OPTICAL ENCODER USING THE ARRAY

(75) Inventor: Toshihiko Aoki, Kawasaki (JP)

(73) Assignee: Mitutoyo Corporation, Kawasaki (JP)

(*) Notice: Subject to any disclaimer, the term of this patent is extended or adjusted under 35 U.S.C. 154(b) by 0 days.

(21) Appl. No.: 10/370,593

(22) Filed: Feb. 24, 2003

(65) Prior Publication Data

US 2003/0164531 A1 Sep. 4, 2003

Related U.S. Application Data

(62) Division of application No. 09/883,344, filed on Jun. 19, 2001, now abandoned.

(30) Foreign Application Priority Data

Jun. 21, 2000 (JP) ........................................ 2000-186800

(51) Int. Cl.$^7$ ......................... H01L 31/00; H01L 31/075
(52) U.S. Cl. ........................ 257/443; 257/594; 257/458; 438/66
(58) Field of Search ................................ 257/594, 443, 257/446, 444, 466, 458, 461; 438/66, 80, 48

(56) References Cited

U.S. PATENT DOCUMENTS

| 4,451,838 A | 5/1984 | Yamazaki |
| 5,030,828 A | 7/1991 | Solomon |
| 5,401,336 A | 3/1995 | Noguchi et al. |
| 5,973,312 A | 10/1999 | Curling et al. |
| 6,157,072 A | 12/2000 | Nakayama et al. |
| 2002/0021450 A1 | 2/2002 | Aoki |

FOREIGN PATENT DOCUMENTS

| GB | 2 094 974 A | 9/1982 |
| GB | 2 352 810 A | 2/2001 |

*Primary Examiner*—Minh-Loan Tran
(74) *Attorney, Agent, or Firm*—Oliff & Berridge, PLC

(57) ABSTRACT

The present invention has an object to provide a photoreceptor array with an excellent device property and no short fault between adjacent photoreceptors and to provide a method of manufacturing such the photoreceptor array with a high yield. On a transparent substrate (31), a transparent electrode (32) and a p-type amorphous silicon layer (33) are formed. An insulating layer (41) is deposited thereon to form a trench (42). In the trench (42), an i-type amorphous silicon layer (34), an n-type amorphous silicon layer (35) and an n-side electrode (36) are buried in turn to form the photoreceptor array.

8 Claims, 9 Drawing Sheets

LIGHT RECEIVING ARRAY, METHOD OF MANUFACTURING THE ARRAY, AND OPTICAL ENCODER USING THE ARRAY

BACKGROUND OF THE INVENTION

1. Field of the Invention

The present invention relates to a photoreceptor array applicable to an optical encoder and method of manufacturing the same.

2. Description of the Related Art

A small optical encoder may include a sensor head that employs an array of photoreceptors also serving as index gratings. This photoreceptor array can provide four-phase displacement signals if four photoreceptors are arrayed in a set with a pitch of $(2n-1)\lambda/4$ where $\lambda$ is a pitch in scale gratings and n is a positive integer.

Such the photoreceptor array can be produced from photodiodes that are fabricated in a single crystal silicon substrate. In this case, however, the smaller the pitch in the array of photoreceptors the larger the crosstalk between photoreceptors adjoining with each other via the substrate. In order to produce a photoreceptor array without such the crosstalk, it is desirable to form photodiodes using amorphous silicon on an insulating substrate such that each photodiode is isolated from others. An array of pin photodiodes can be obtained when amorphous silicon of p-, i- and n-types are layered on the insulating substrate and subsequently etched.

If an interval between PDs is as fine as 4 μm or below, the method of manufacturing a PD (photodiode) array using the etching of amorphous silicon layers makes an aspect ratio larger, remains etching residues easily and causes short faults between adjacent PDs. A dry etching such as a plasma etching may be employed for fine etching of amorphous silicon. This etching process often imparts damages on PDs and diffuses impurities from sidewalls into PDs. For these reasons, the conventional method can not achieve an excellent PD property and high yield.

SUMMARY OF THE INVENTION

The present invention has an object to provide a photoreceptor array with an excellent device property and no short fault between adjacent photoreceptors and to provide a method of manufacturing such the photoreceptor array with a high yield.

The present invention is provided with a photoreceptor array, which comprises a substrate; an insulating layer formed on the substrate, the insulating layer having a plurality of trenches formed therein for burying devices; a plurality of photoreceptors formed from semiconductor layers buried in each of the trenches in the insulating layer; and an output signal line formed on the plurality of photoreceptors via an interlayer insulator.

The present invention is also provided with a method of manufacturing a photoreceptor array, which comprises the steps of providing a substrate; forming an insulating layer on the substrate; forming a plurality of trenches in the insulating layer; forming a plurality of photoreceptors from semiconductor layers buried in each of the trenches in the insulating layer; and forming an output signal line on the plurality of photoreceptors via an interlayer insulator.

According to the present invention, the photoreceptor array is formed from the semiconductor layers buried in the trenches in the insulating layer on the substrate. Therefore, adjacent photoreceptors in the array can be isolated from each other reliably with no problem to cause a short fault therebetween. Accordingly, a fine pitch array of photoreceptors can be obtained with an excellent device property and high yield.

In an embodiment, the substrate may be composed of a transparent substrate. In addition, the photoreceptor array may further comprise a transparent electrode that is formed between the transparent substrate and the insulating layer and is operative as a lower electrode common to the plurality of photoreceptors. In this photoreceptor array, the back surface of the substrate is employed to receive a light. If the photoreceptors have upper electrodes, and each of which is composed of a transparent electrode, the upper electrodes may be employed to receive a light from above. In this photoreceptor array, the substrate is not required transparent and the lower electrode may be a metallic electrode.

Preferably, the plurality of photoreceptors may have upper electrodes, each of which may be self-aligned with and buried in the trench. This can prevent short faults between photoreceptors in contrast to the case where the upper electrodes are etched for pattern formation.

In an embodiment, the photoreceptor may be a pin or pn photodiode (PD). In this case, p-type layers in the plurality of PDs may be formed as a single and common p-type layer continuously on the common lower electrode. An i-type layer and an n-type layer are buried and formed in each trench.

The present invention is further provided with an optical encoder, which comprises a scale having optical gratings formed thereon along a measurement axis; and a sensor head including a photoreceptor array for detecting displacements of the scale to provide a plurality of displacement signals with different phases. The photoreceptor array includes a substrate; a lower electrode formed on the substrate; an insulating layer formed on the substrate, the insulating layer having a plurality of trenches formed therein for burying devices; a plurality of photoreceptors formed from semiconductor layers buried in each of the trenches in the insulating layer, the plurality of photoreceptors each having an upper electrode formed thereon; and an output signal line formed on the plurality of photoreceptors via an interlayer insulator.

According to the present invention, a high performance optical encoder with a fine scale pitch can be obtained.

Other features and advantages of the invention will be apparent from the following description of the preferred embodiments thereof.

BRIEF DESCRIPTION OF THE DRAWINGS

The present invention will be more fully understood from the following detailed description with reference to the accompanying drawings in which.

DETAILED DESCRIPTION OF THE PREFERRED EMBODIMENTS

Preferred embodiments of the present invention will be described below with reference to the drawings.

Figure 1:
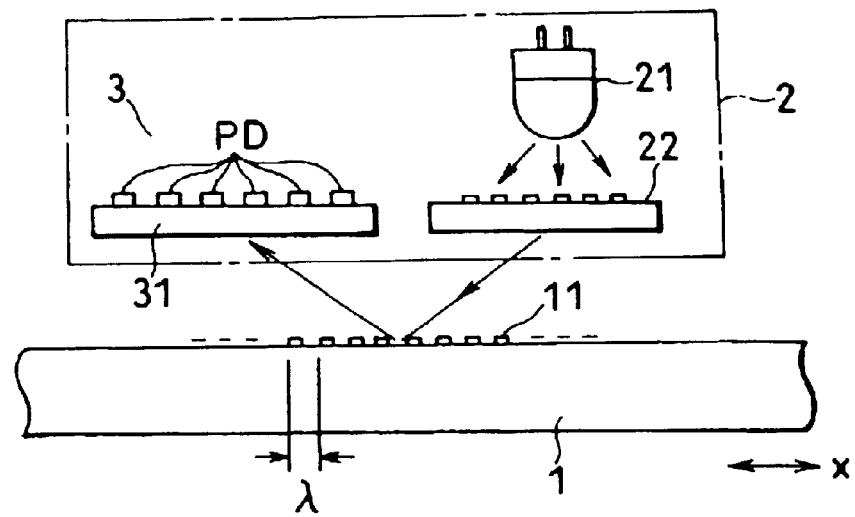
FIG. 1 shows an arrangement of an optical encoder of reflection type that employs a photoreceptor array of the present invention.
Figure 2:
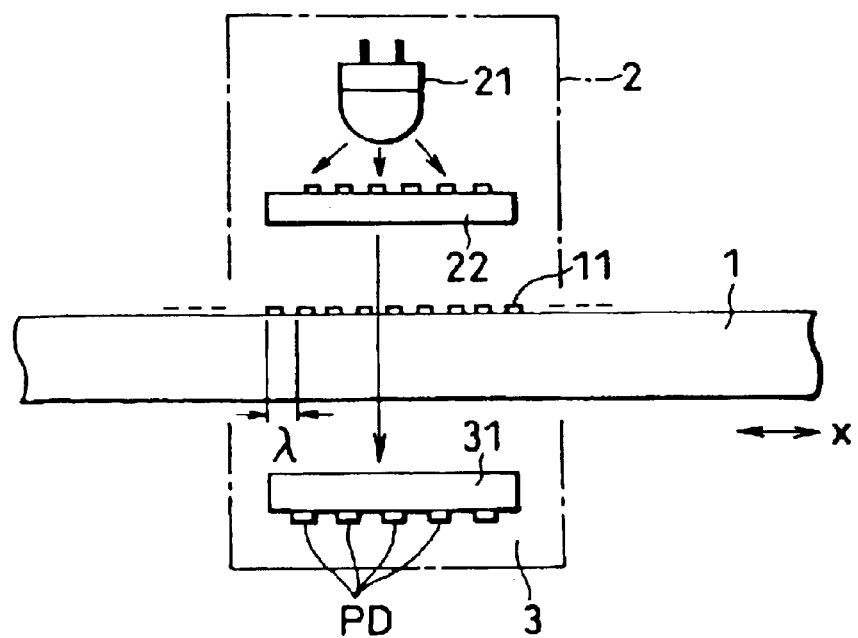
FIG. 2 shows an arrangement of an optical encoder of transmission type that employs a photoreceptor array of the present invention.

FIGS. 1 and 2 show arrangements of optical encoders that employ a photoreceptor array of the present invention. FIG. 1 shows a reflective optical encoder and FIG. 2 a transmissible optical encoder. The optical encoders both comprise a scale 1 having optical gratings 11 formed thereon with a certain pitch of λ along a measurement axis x and a sensor head 2 relatively movable and opposite to the scale 1 for reading the optical gratings.

The sensor head 2 includes a light source such as an LED 21, index gratings 22 for modulating a light output from the source to irradiate the scale 1, and a photoreceptor array 3 for receiving a light from the scale 1. The photoreceptor array 3 includes pin (or pn) photodiodes (PD) formed from amorphous silicon and arrayed on a transparent substrate 31. The PDs are formed on a surface of the transparent substrate 31 opposite to the surface that faces to the scale 1. Thus, the photoreceptor array 3 detects a light that enters through the transparent substrate 31.

Figure 3A:
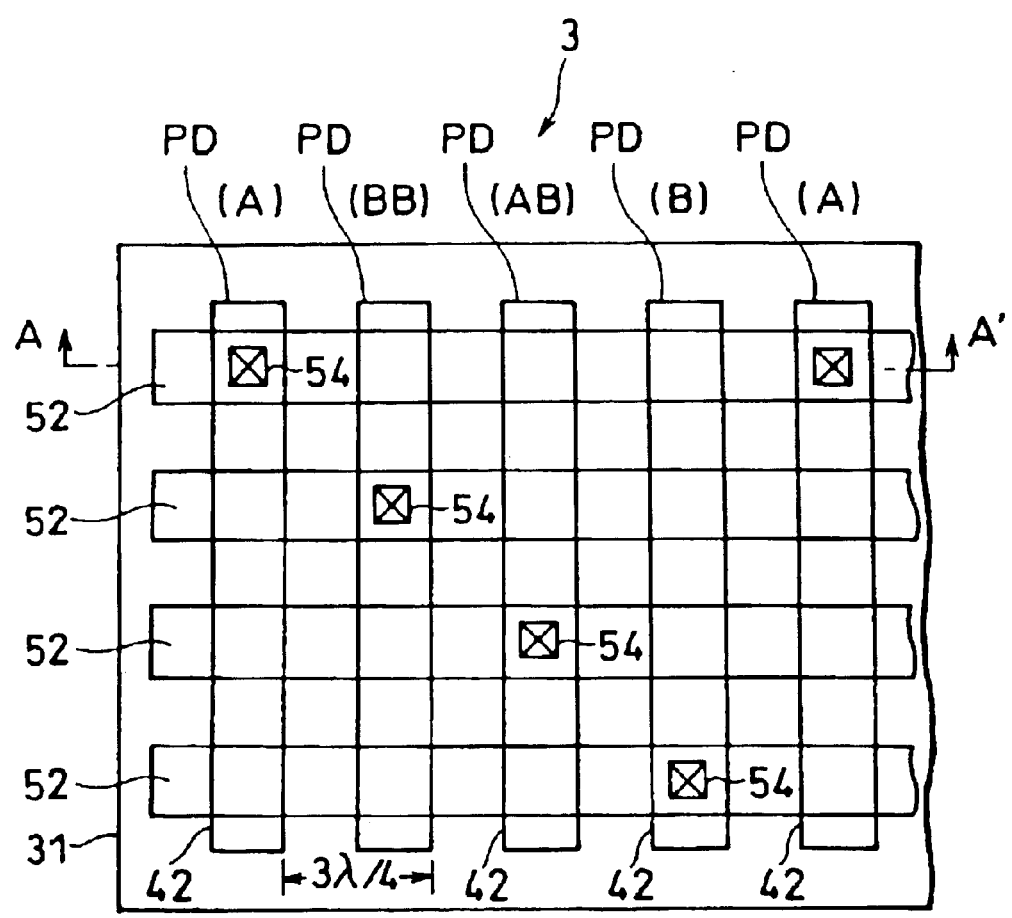
FIG. 3A is a top view showing an arrangement of a photoreceptor array according to an embodiment of the present invention.
Figure 3B:
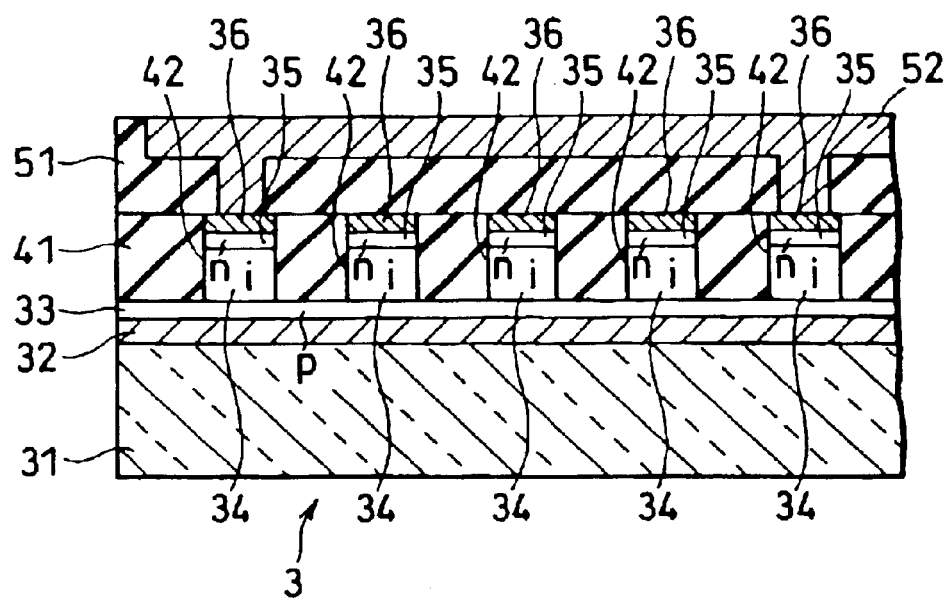
FIG. 3B is a cross-sectional view taken along an A–A' line in FIG. 3A.

FIGS. 3A–3B are a top view showing an embodied arrangement of the photoreceptor array 3 and a cross-sectional view thereof taken along an A–A' line. The transparent substrate 31 is composed of a glass substrate, for example. Formed on the transparent substrate 31 is a transparent electrode 32 that is employed as a lower electrode (p-side electrode) common to the photoreceptor array 3. Formed on the transparent electrode 32 is a p-type amorphous silicon layer (hereinafter simply referred to as a "p-type layer") 33 that is employed as an anode layer common to the photoreceptor array 3. The transparent electrode 32 comprises a film of transparent conductor selected from ITO, $SnO_2$, ZnO and the like.

An insulating layer 41 is formed on the p-type layer 33 above the substrate. The insulating layer 41 has narrow long rectangular trenches 42 formed therein with a certain pitch of 3λ/4, for example, where λ is a scale pitch. Each trench 42 is employed to bury a PD. A part of the PD actually buried in the trench 42 includes an i-type amorphous silicon layer (hereinafter simply referred to as an "i-type layer") 34. The part also includes an n-type amorphous silicon layer (hereinafter simply referred to as an "n-type layer") 35 as a cathode layer that is laminated on the i-type layer 34, and an upper electrode (n-side electrode) 36 that contacts then-type layer 35. Thus, each PD is self-aligned with the trench 42, from a photoelectric conversion layer to an upper electrode, and is buried and formed in the trench 42.

An interlayer insulator 51 is formed on the insulating layer 41 that includes the PDs buried therein. Output signal lines 52 are formed on the interlayer insulator 51 and are connected to the n-side electrode 36 in each PD. Four signal lines 52 are provided to obtain four-phase outputs with A-, BB-, AB- and B-phases as shown in FIG. 3A. They respectively contact the n-side electrode 36 in the corresponding PD via contact holes 54.

Figure 4:
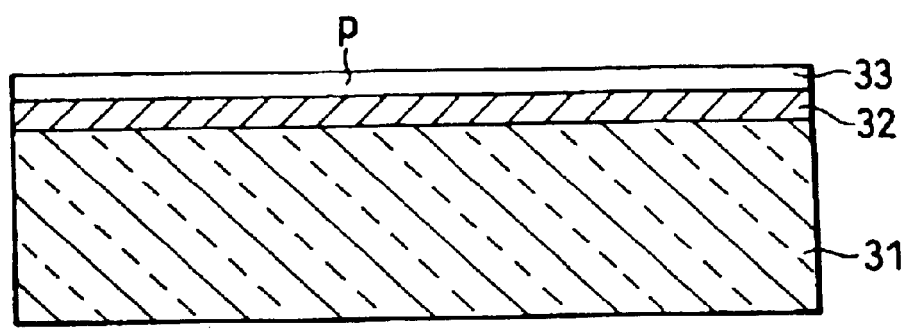
FIGS. 4–14 are cross-sectional views showing process steps of manufacturing the photoreceptor array.
Figure 5:
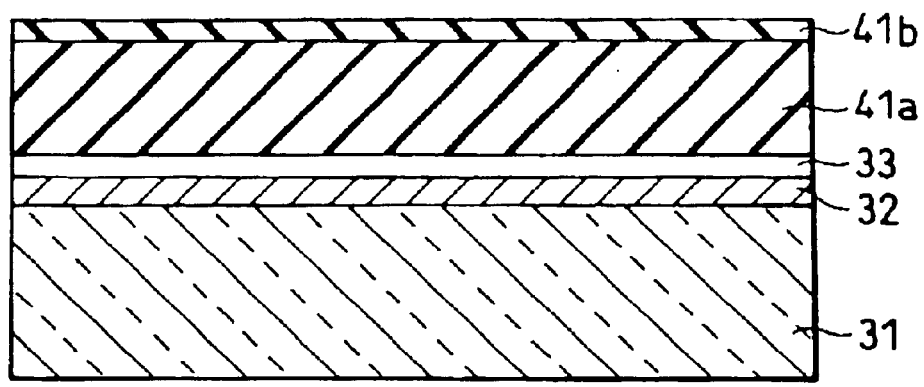

Process steps of manufacturing the photoreceptor array 3 will be described using cross sections of FIGS. 4–14 corresponding to the cross section of FIG. 3B. First, as shown in FIG. 4, the transparent electrode 32 is formed over the whole surface of the transparent substrate 31 and the p-type layer 33 is then formed over the transparent electrode 32. Subsequently, the insulating layer 41 is deposited thereon as shown in FIG. 5. The insulating layer 41 has a specific laminated structure with a thick film of silicon oxide ($SiO_2$) 41a formed by CVD and a thin film of silicon nitride ($Si_3N_4$) 41b formed by plasma CVD.

Figure 6:
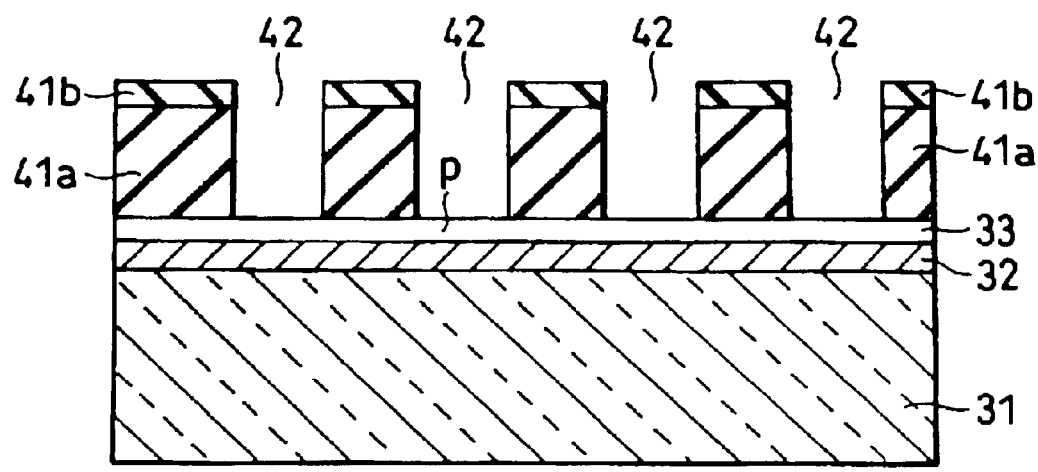

Next, the trenches 42 are formed in the insulating layer 41 as shown in FIG. 6. Specifically, a resist pattern is formed by lithography, then the silicon nitride 41b is etched by RIE, and the silicon oxide 41a is etched by RIE using a different gas. In this case, if a conditioned large selective etching ratio to the silicon nitride is employed when the silicon oxide 41a is etched, the silicon nitride 41b serves as an etching mask. As a result, the thick silicon oxide 41a can be etched to form the trench 42 with vertical sidewalls.

Figure 7:
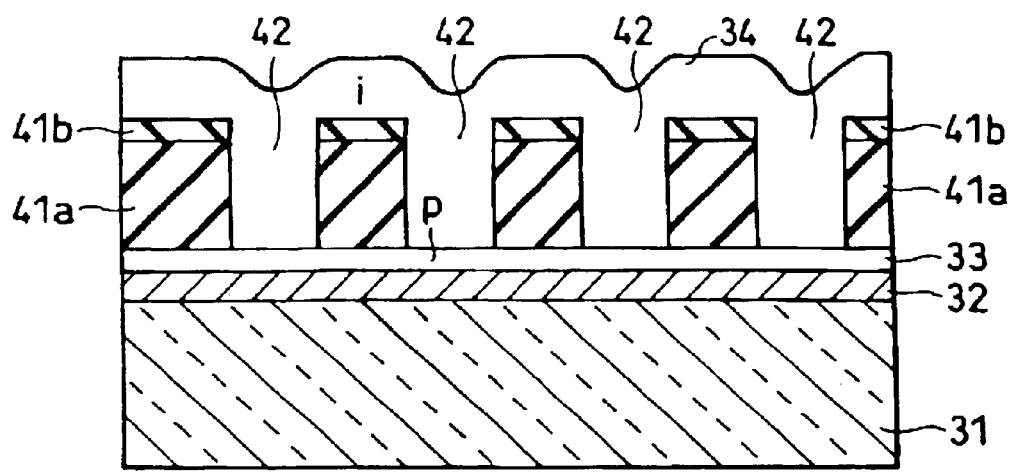
Figure 8:
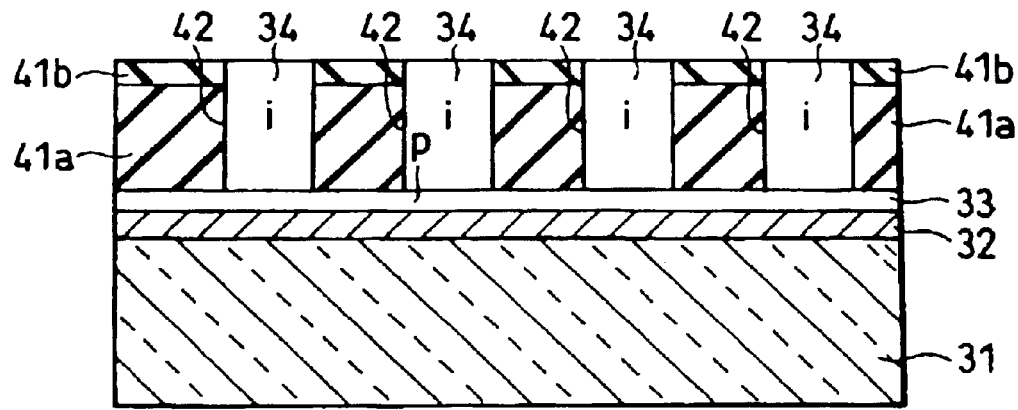
Figure 9:
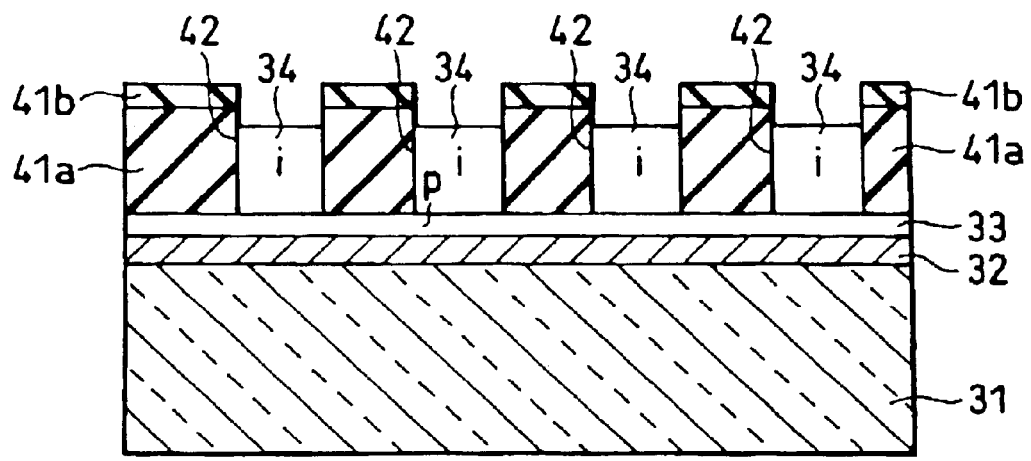

Thereafter, the i-type layer 34 is deposited thereon as shown in FIG. 7. Then, the i-type layer 34 is subjected to planarization by CMP (Chemical Mechanical Polishing) to be buried in the trench 42 as shown in FIG. 8. Further, the i-type layer 34 is subjected to a recess etching by a dry or wet etching to make a certain recessed step above the i-type layer 34 that is buried in the trench 42 as shown in FIG. 9.

Figure 10:
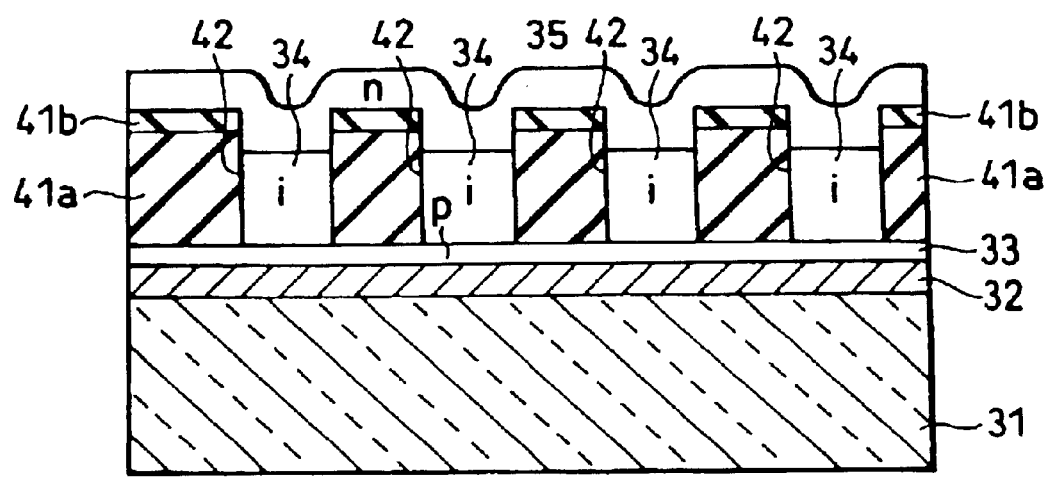
Figure 11:
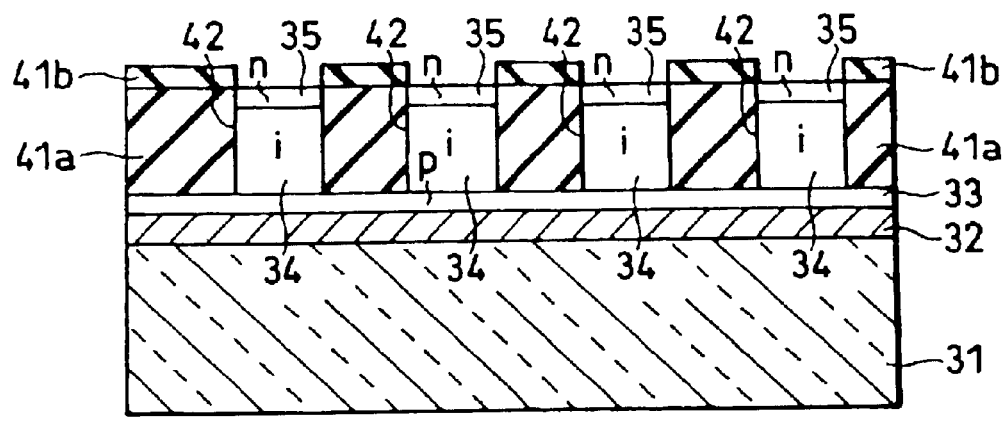

Subsequently, the n-type layer 35 is deposited thereon as shown in FIG. 10. The n-type layer 35 is then subjected to CMP planarization and recess etching to obtain such the n-type layer 35 that is buried in the trench 42 up to a certain recessed step as shown in FIG. 11.

Figure 12:
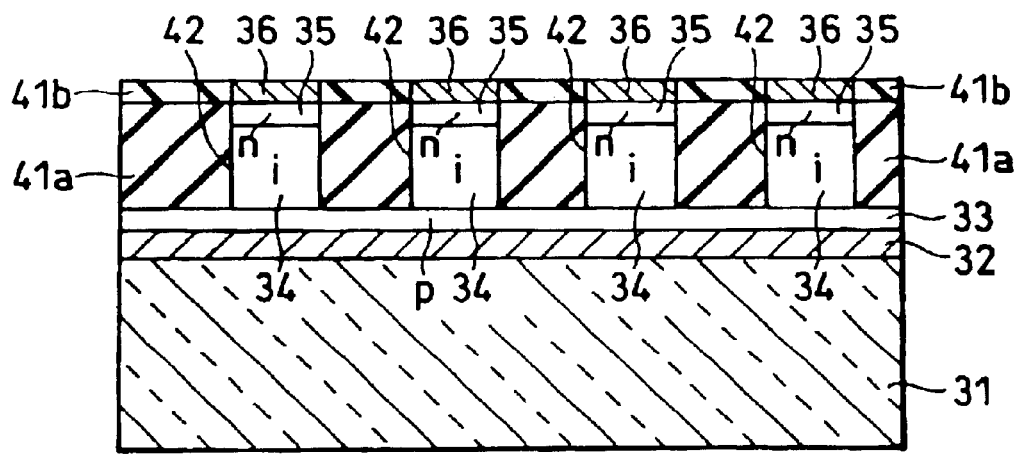

Then, as shown in FIG. 12, the n-side electrode (metallic electrode) 36 is buried in the trench 42 and formed to contact the adjacent n-type layers 35. The process of burying the n-side electrode 36 is also performed through deposition and planarization of a metallic film.

Figure 13:
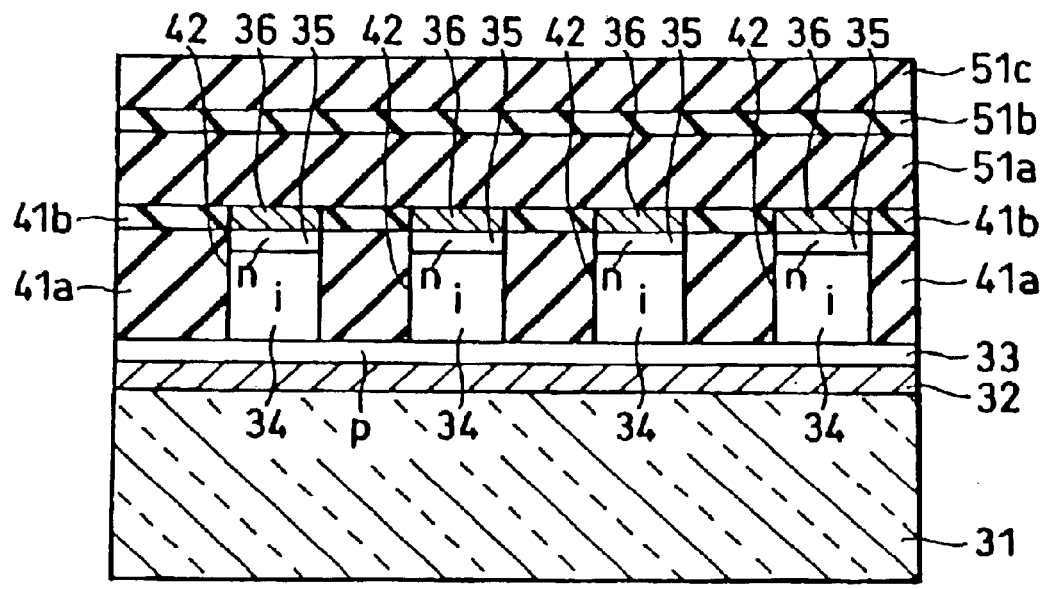

Next, the interlayer insulator 51 is deposited by CVD as shown in FIG. 13. In this embodiment, to form contacts of the signal lines to PDs by the dual damascene technology, the interlayer insulator 51 has a stacked structure consisting of layers of silicon oxide 51a, silicon nitride 51b and silicon oxide 51c.

Figure 14:
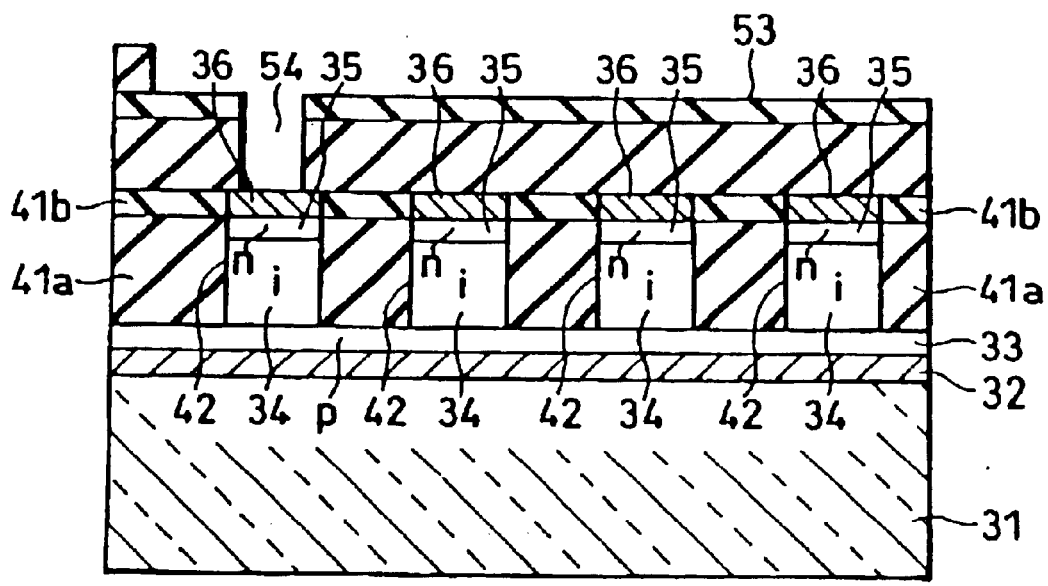

For the stacked interlayer insulator 51, as shown in FIG. 14, a groove 53 for burying a line and a contact hole 54 are formed. A metal is buried in the groove 53 and contact hole 54 to form the output signal line 52 as shown in FIG. 3B. The output signal line 52 may be covered with a passivating film, if required.

As described above, according to the present embodiment, the photoreceptor array can be produced from amorphous silicon while each of photoreceptors is reliably isolated from others. Only the recess etching is employed to slightly remove the surface of the amorphous silicon after it is buried in the trench. A wet etching can be employed as the recess etching to reduce damages imparting on the amorphous silicon. Thus, a fine pitch array of photoreceptors can be produced with an excellent property that includes no crosstalk, for example.

It is particularly important in the present embodiment that a part of a photoreceptor, from an photoelectric conversion layer to the n-type layer 35 and n-side electrode 36 for providing output signals with different phases, is buried in the trench 42 to reliably isolate from other photoreceptors. This structure can prevent crosstalk that will otherwise occur among output signals with different phases.

Such the photoreceptor array can be employed to configure an optical encoder with a high performance. As shown in FIGS. 1 and 2, the photoreceptor array 3 in the sensor head 2 is not opposed directly to the scale 1 and accordingly has no problem to be damaged and contaminated from contacting the scale 1.

In the above embodiment, the substrate is composed of a transparent substrate and the photoreceptor array is configured to receive a light through the substrate. Instead the photoreceptor array may also be configured to receive a light from above at photoreceptors that are buried in trenches formed in an insulating layer.

Figure 15:
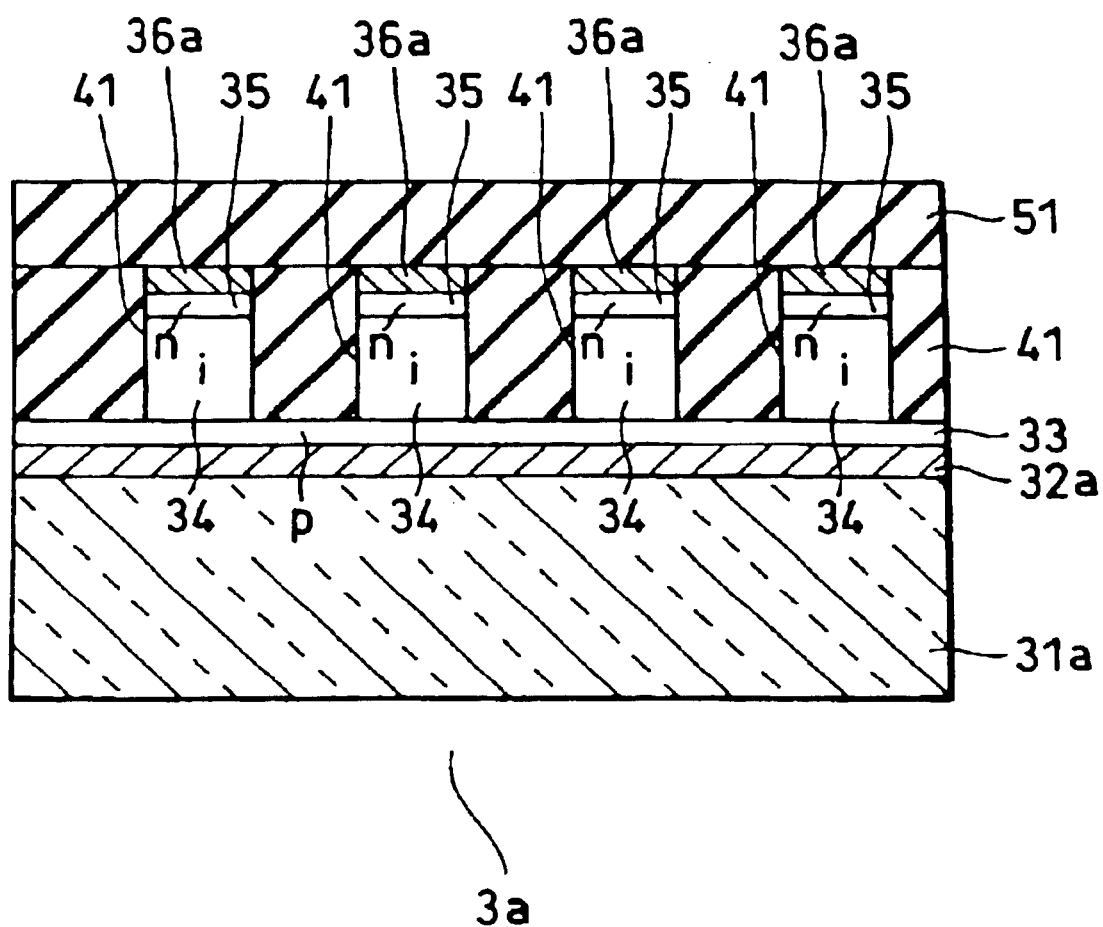
FIG. 15 is a cross-sectional view of another photoreceptor array.

FIG. 15 shows a cross-sectional structure, corresponding to FIG. 3B, of a photoreceptor array 3a according to such the embodiment. The substrate 31a may not be a transparent substrate in contrast to FIG. 3B. A metallic electrode is employed as a lower electrode 32a common to PDs. On the other hand, a transparent electrode is employed as an upper electrode 36a of each PD. Process steps are the same as those in the previous embodiment.

In this embodiment, a signal line to be connected to each upper electrode 36a is omitted in FIG. 15. Though, it can contact an edge of the upper electrode 36a and be drawn therefrom without covering the surface of the PD as long as possible. The photoreceptor array in this embodiment is similarly applicable to an optical encoder but the surface, on which PDs are formed, must face to the scale in contrast to FIGS. 1 and 2.

The present invention is not intended to limit to the above embodiments. For example, other photoelectrically convertible semiconductors such as ZnSe and CdSe may also be employed while the amorphous silicon is used for the semiconductor layers in the above embodiments.

In addition, unlike the p-type layer in the above embodiments that is commonly used for every PD, a p-type layer may be independently buried in each trench. Furthermore, the order of stacking p-, i- and n-layers on the substrate is employed in the above embodiments to form a PD, though it can be reversed. In this case, output signal lines are to be formed beneath the insulating layer 41.

Planarization may be performed through the use of etching such as dry etching and wet etching while it is executed by CMP in the above embodiments. In FIG. 1 a light beam is introduced obliquely into the scale 1, though a reflective encoder of vertical entry type can be configured if the PD substrate 31 also serves as the index gratings 22.

As obvious from the forgoing, according to the present invention, each photoreceptor in an array of photoreceptors is produced by burying semiconductor layers in a trench that is formed in an insulating layer on a substrate. Therefore, adjacent photoreceptors in the array are reliably isolated from each other. Accordingly, an array of photoreceptors can be produced with no problem to cause a short fault, an excellent device property, a fine pitch and a high yield.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. An optical encoder, comprising:
    a scale having optical gratings formed thereon along a measurement axis; and
    a sensor head including a photoreceptor array for detecting displacements of said scale to provide a plurality of displacement signals with different phases, said photoreceptor array including:
        a substrate;
        a lower electrode formed on said substrate;
        an insulating layer formed on said substrate, said insulating layer having a plurality of trenches formed therein for burying devices;
        a plurality of photoreceptors formed from semiconductor layers buried in each of said trenches in said insulating layer, said plurality of photoreceptors each having an upper electrode formed thereon; and
        an output signal line formed on said plurality of photoreceptors via an interlayer insulator, wherein said insulating layer has laminated upper and lower films, said upper film serving as an etching mask of said lower film using RIE.

2. The optical encoder according to claim 1, wherein said substrate is composed of a transparent substrate and said lower electrode is composed of a transparent electrode, and wherein the back surface of said substrate is employed in said photoreceptor array to receive a light therethrough.

3. The optical encoder according to claim 1 wherein said upper electrode is composed of a transparent electrode, and wherein said upper electrode is employed in said photoreceptor array to receive a light therethrough.

4. A method of manufacturing a photoreceptor array, comprising the steps of:
    providing a substrate;
    forming an insulating layer on said substrate;
    forming a plurality of trenches in said insulating layer;
    forming a plurality of photoreceptors from semiconductor layers buried in each of said trenches in said insulating layer; and
    forming an output signal line on said plurality of photoreceptors via an interlayer insulator.

5. The method according to claim 4, further comprising the step of forming a lower electrode common to said plurality of photoreceptors prior to forming said insulating layer on said substrate.

6. The method according to claim 4, further comprising the steps of:
    forming a lower electrode common to said plurality of photoreceptors; and
    forming a p-type semiconductor layer operative as an anode layer common to said plurality of photoreceptors on said lower electrode prior to forming said insulating layer on said substrate.

7. The method according to claim 6, wherein said step of forming the plurality of photoreceptors includes burying an i-type semiconductor layer and an n-type semiconductor layer in turn in said trenches.

8. The method according to claim 6, wherein said step of forming the plurality of photoreceptors includes burying an i-type semiconductor layer, an n-type semiconductor layer and an upper electrode in turn in said trenches.

* * * * *